US007602244B1

(12) United States Patent
Holmes et al.

(10) Patent No.: US 7,602,244 B1
(45) Date of Patent: Oct. 13, 2009

(54) POWER AMPLIFIER BIAS SYNCHRONIZATION

(75) Inventors: Damon G. Holmes, Calgary (CA); David M. Tholl, Calgary (CA); Peter Zahariev Rashev, Calgary (CA); John-Peter van Zelm, Calgary (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 49 days.

(21) Appl. No.: 11/945,624

(22) Filed: Nov. 27, 2007

(51) Int. Cl.
*H03F 1/26* (2006.01)
(52) U.S. Cl. .................... 330/149; 330/285
(58) Field of Classification Search .............. 330/129, 330/136, 149, 279, 285; 375/296, 297
See application file for complete search history.

(56) References Cited

U.S. PATENT DOCUMENTS 7,263,135 B2* 8/2007 Takabayashi et al. ....... 375/296
7,333,557 B2* 2/2008 Rashev et al. ............... 375/296

OTHER PUBLICATIONS

Wang, Feipeng, "Design of Wide-Bandwidth Envelope-Tracking Power Amplifiers for OFDM Applications", *IEEE Transactions on Microwave Theory and Techniques*, vol. 53, No. 4, (Apr. 2005), 1244-1255.

* cited by examiner

*Primary Examiner*—Khanh V Nguyen
(74) *Attorney, Agent, or Firm*—Schwegman, Lundberg & Woessner, P.A.

(57) ABSTRACT

A power amplifier system includes a nonlinear power amplifier that receives a predistorted input signal. A receiver receives an output signal from the power amplifier and provides an observed signal. A bias controller provides a delayed dynamic bias signal to the power amplifier wherein the bias signal delay is dynamic and is a function of the observed signal for synchronizing the predistorted input signal with the dynamic bias signal. A method is also described that alternately adjusts predistortion delays and bias signal delays as a function of observed signals.

20 Claims, 4 Drawing Sheets

POWER AMPLIFIER BIAS SYNCHRONIZATION

BACKGROUND

Radio transmitters amplify input signals. It is desired that the gain of such transmitters be linear for the entire range of input signals. A common architecture of recently proposed baseband power amplifier linearizers includes a digital nonlinear gain block, usually called a predistortion block, inserted in the transmitter chain prior to upconversion stages. The predistortion block may be continuously adapted to approximate the inverse nonlinear complex gain of the following transmitter stages up to the power amplifier.

In a conventional linearizer, the non-linearity of the transmitter and power amplifier is corrected by applying an inverse non-linear gain characteristic to the input signal. The non-linear gain characteristic can be determined using a linear receiver and adaptive predistortion controllers. A delayed input signal is compared to an observed sample of the output signal. The amount of delay applied to the input signal is related to the delay of the transmission and observation systems.

In some amplifiers, an amplifier bias may be modified as a function of the envelope of an RF signal. The bias signal is manually synchronized to match up with the input signal. A fixed delay may be provided by a desired length of cable. In some cases, it may be difficult to use a proper length of cable, or the power amplifier may be changed, resulting in a new cable length being needed to obtain the proper delay for the new amplifier. While dynamic biasing of the power amplifier (PA) is known to increase power efficiency, bias signal misalignment with the transmission signal causes interference with the synchronization of the delayed input signal and observed signal resulting in undesired emissions in the output signal.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media such as memory or other type of storage devices. The term "computer readable media" is also used to represent any means by which the computer readable instructions may be received by the computer, such as by different forms of wired or wireless transmissions. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

A dynamic bias synchronization system aligns in time a dynamic bias signal with a transmission signal for a power amplifier that amplifies RF signals. It is desired that the synchronization of the dynamic bias signal does not interfere with the synchronization of a linearizer that predistorts an input signal to the power amplifier. Multiple embodiments are described which may increase the robustness of signal transmitters with power transistor bias synchronization.

The effects of dynamic bias misalignment can be seen if the power amplifier is modeled as an AM transmitter in which the amount of amplitude modulation is related to the ratio of the delayed bias signal to the synchronized bias signal. An AM model for the dynamically biased PA can be written as:

$$S_{out}(t) = \left(1 + m \cdot \frac{S_{bias}(t-\tau)}{S_{bias}(t)}\right) S_{in}(t)$$

where $S_{out}(t)$ is the output signal, $S_{in}(t)$ is the input signal, m is a small modulation index constant, $S_{bias}(t)$ is the power amplifier bias signal and $\tau$ is the amount of misalignment. When $\tau$ is nonzero, the output signal and consequently the observed signal becomes distorted causing poor transmission signal quality. Accurate synchronization of the delayed input signal and observed signal also becomes difficult.

Figure 1:
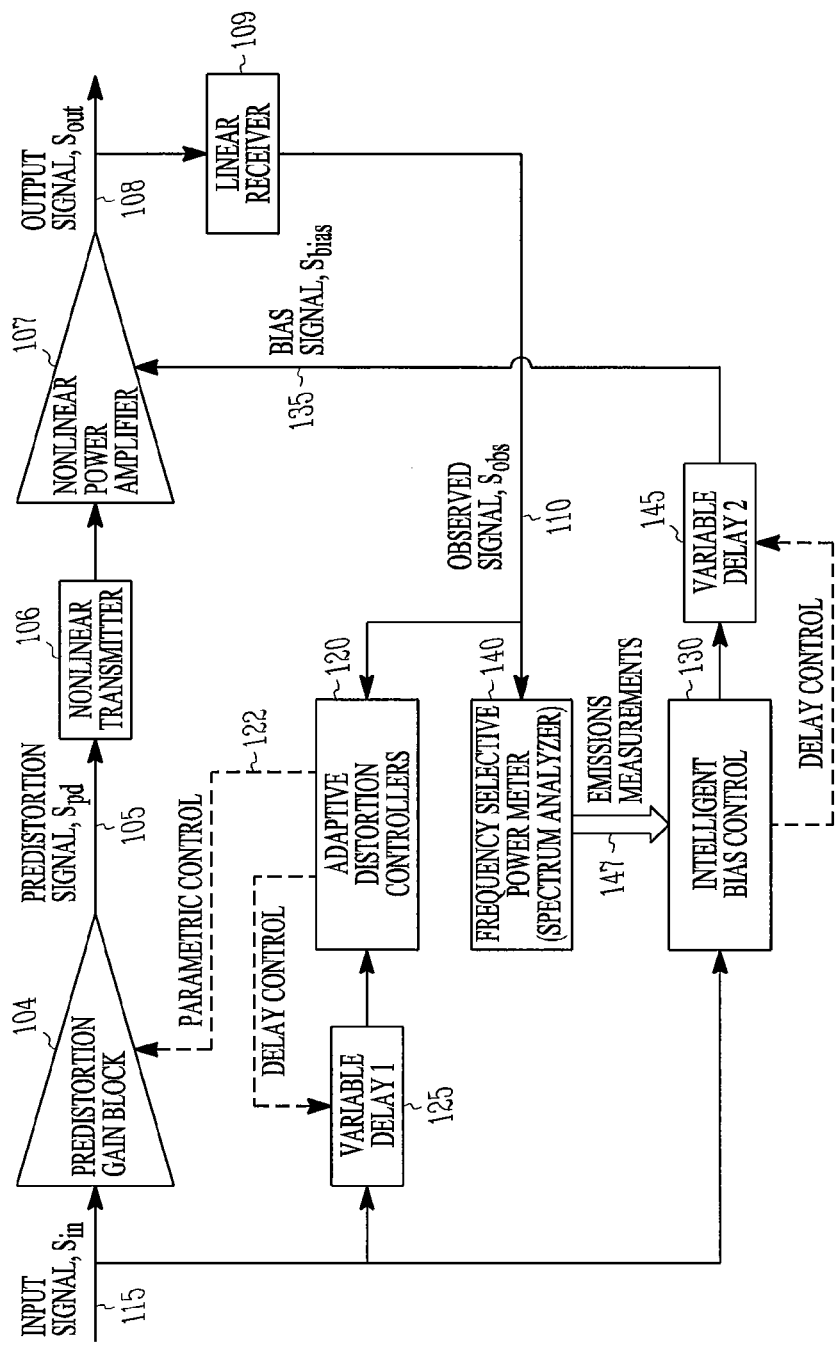
FIG. 1 is a block diagram of a transmitter with linearization and dynamic power amplifier biasing according to an example embodiment.

In one embodiment, synchronization of a dynamic bias signal with a transmission signal can be accomplished with a system 100 shown in FIG. 1. A predistortion gain block 104 provides a predistorted input signal $S_{pd}$ at 105 to a nonlinear transmitter 106. Transmitter 106 is coupled to a nonlinear power amplifier 107 that provides an output signal $S_{out}$ at 108. A linear receiver 109 receives the output signal and provides an observed signal $S_{obs}$ at 110.

The observed signal, $S_{obs}$, at 110 is synchronized with the input signal, $S_{in}$, at 115 within an Adaptive Predistortion Controller block 120 using an early-late cross correlation technique to control a Variable Delay 1 block at 125. Variable Delay 1 block 125 may be implemented as digital fractional delay filter.

Adaptive predistortion controller block 120 also provides a parametric control signal 122 to the predistortion gain block 104 to control the predistortion of the input signal $S_{in}$. The predistortion gain block 104 provides its own synchronization using an early/late correlation in one embodiment. If the bias signal is not synchronized correctly, it can result in interference with synchronization of the predistortion gain block synchronization and poor output signal quality.

An Intelligent Bias Control block 130 controls the delay of a Dynamic Bias Signal 135. Intelligent Bias Control block 130 has been given knowledge of the non-linear power amplifier beforehand. Block 130 knows the appropriate bias level for a given input signal amplitude. In one embodiment, it may be implemented as a look-up table. Block 130 may also contain registers and comparators to make appropriate decisions based on its inputs.

A Frequency Selective Power Meter 140 measures the signal quality of the observed signal 110 and provides an emissions measurement value 137 to the intelligent bias control 130. In one embodiment, the power meter measures the power of the observed signal over frequency. A high ratio of power outside the desired frequency results in a poor signal quality, while low power outside the desired frequency corresponds to good signal quality. The emissions measurement value 137 may be a multiple bit digital representation of the signal quality in one embodiment.

The Intelligent Bias Control or controller 130 sweeps a Variable Delay 2 block at 145 as a function of the emissions measurement value 137 until a delay corresponding to maximum signal quality is discovered, at which point the dynamic bias signal 135 is synchronized. In one embodiment, Variable Delay blocks 125 and 145 may be implemented as digital fractional delay filters. Other methods of controllably delaying a signal may also be used.

In one embodiment, the intelligent bias controller 130 is aware of the details of the power amplifier, which has been pre-characterized. Controller 130 thus provides an appropriate bias signal as a function of the amplitude of the input signal. It also generates a delay value, such as zero, or other value such as a random value upon start up. It then steps through different voltages to maximize the signal quality, essentially converging on the proper delay for variable delay 2 at 145. As indicated above, block 130 may be implemented as a look-up table. In further embodiments, other methods of calculating the bias signal may be used, such as the use of equations created to provide the appropriate bias signal.

In one embodiment, the input signal bandwidth is in the range of 10 to 20 MHz. The transmitter block 106 modulates the predistorted signal 105 onto an RF carrier which may be up to 3.5 GHz or higher.

Figure 2:
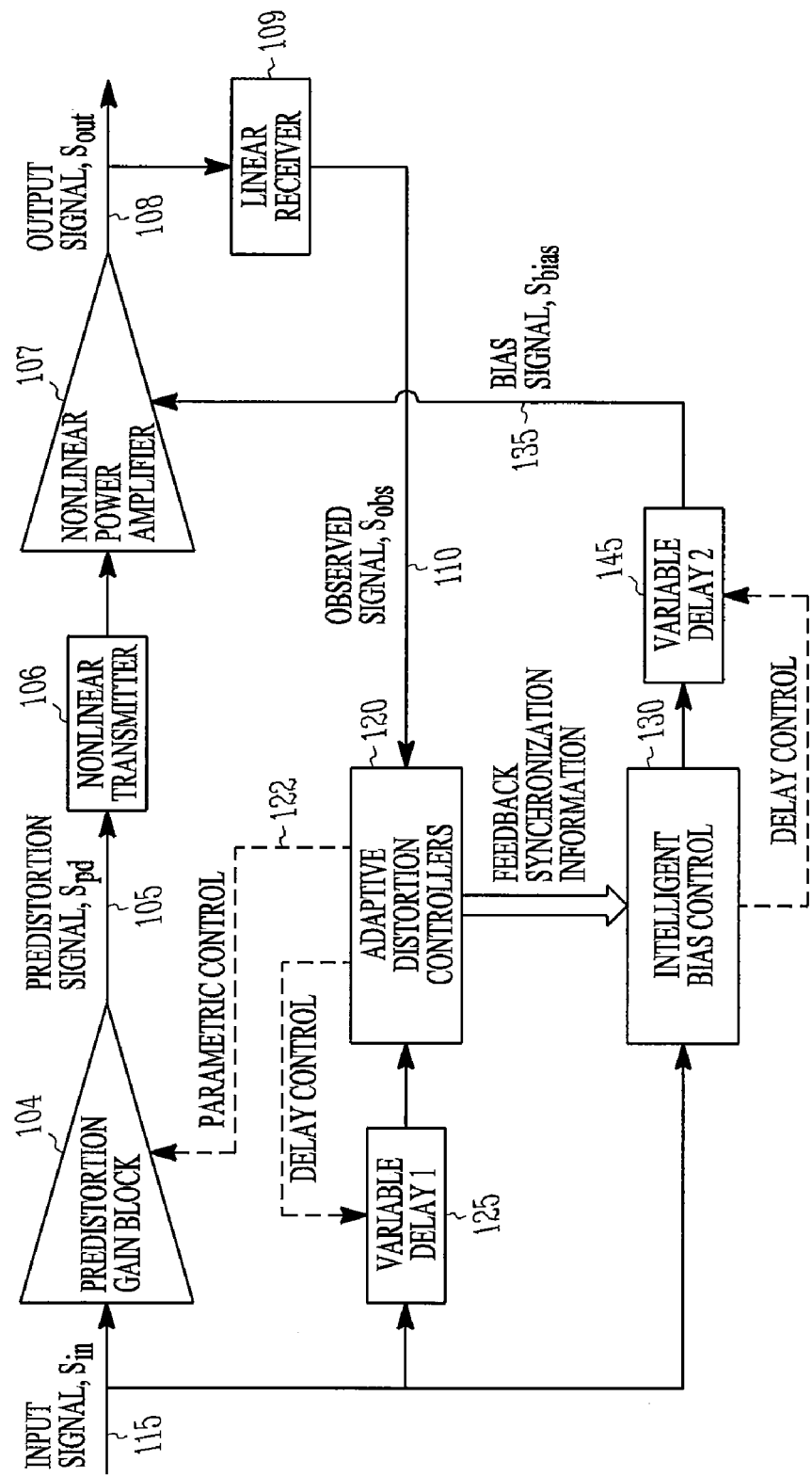
FIG. 2 is a block diagram of an alternative transmitter with linearization and dynamic power amplifier biasing according to an example embodiment.

Another dynamic bias synchronization system is illustrated at 200 in FIG. 2. In system 200, dynamic bias synchronization occurs at system startup or during maintenance windows. In this embodiment, the adaptive predistortion controller measures a phase difference between the input signal and the observed signal and provides feedback synchronization information to the intelligent bias control 130, obviating the need for power meter 140. The numbering of elements is consistent with the numbering of FIG. 1.

Figure 3:
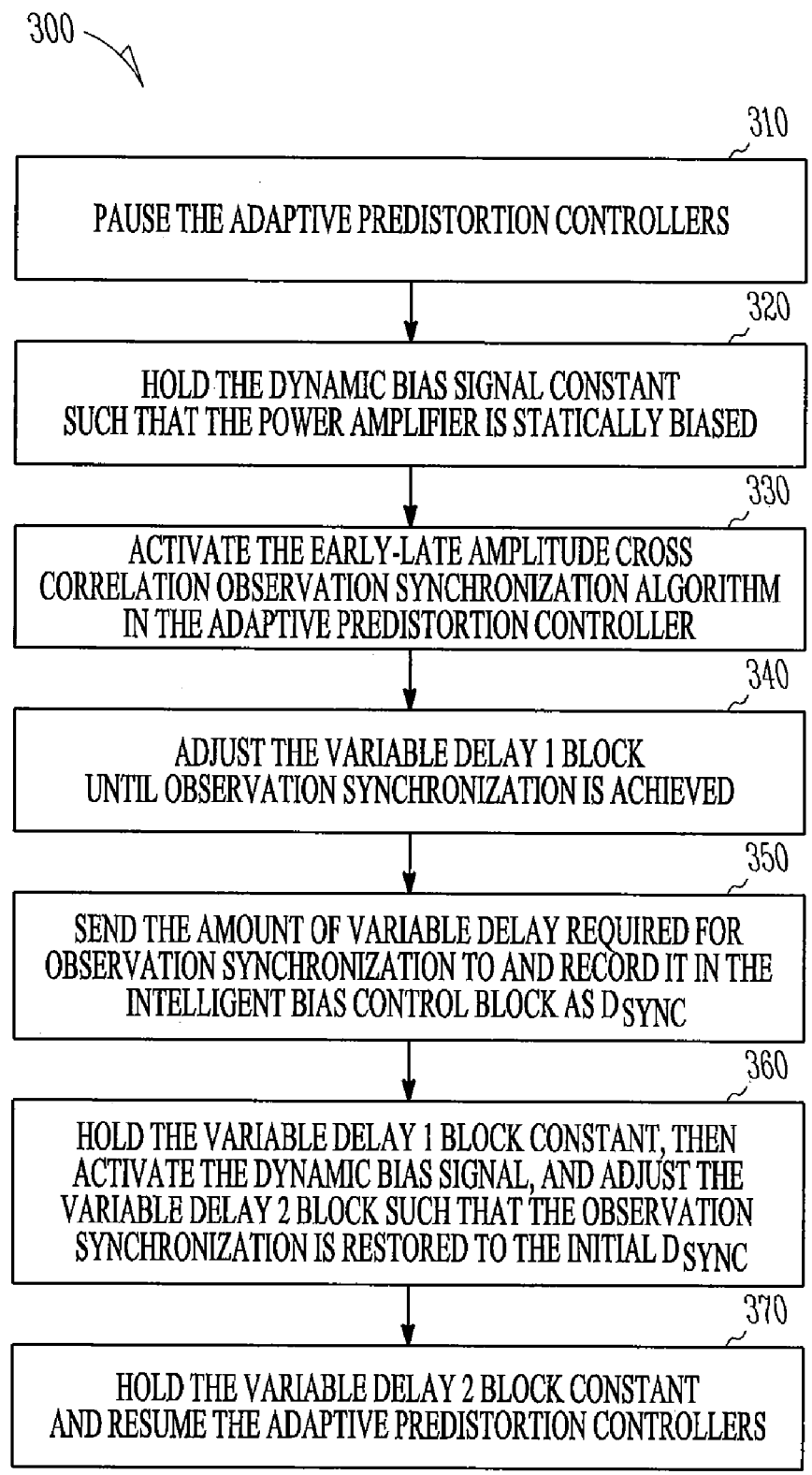
FIG. 3 is a flowchart illustrating a method of synchronizing the dynamic bias signal according to an example embodiment.

FIG. 3 is a flowchart illustrating a method 300 of synchronizing the dynamic bias signal 135. To synchronize the dynamic bias signal, the adaptive predistortion controllers 120 are first paused at 310. The Intelligent Bias Controller 130 then holds the dynamic bias signal constant such that the power amplifier is statically biased at 320. The early-late amplitude cross correlation observation synchronization algorithm is activated at 330 in the adaptive predistortion controllers 120 and the Variable Delay 1 block 125 is adjusted at 340 until observation synchronization is achieved. The amount of variable delay required for observation synchronization is sent at 350 to and recorded in the Intelligent Bias Control block 130 as $D_{sync}$. With the Variable Delay 1 block 125 held constant, the Intelligent Bias Control block then activates at 360 modulation of the dynamic bias signal and adjusts the Variable Delay 2 block 145 such that observation synchronization is restored to the initial $D_{sync}$. Variable Delay 2 block 145 is then held constant and the adaptive predistortion controllers are resumed at 370. Method 300 continues to alternately adjusts predistortion delays and bias signal delays as a function of observed signals.

Figure 4:
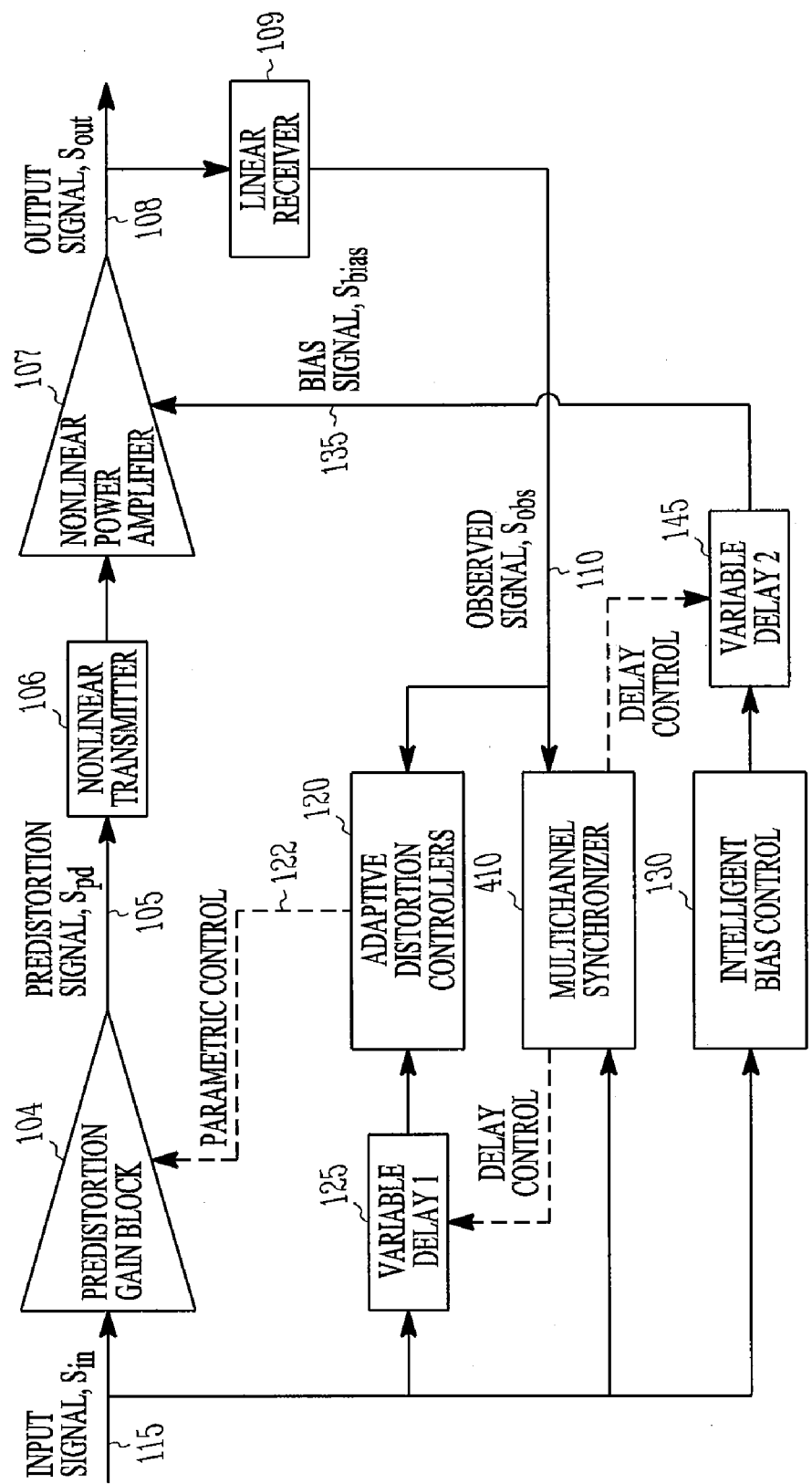
FIG. 4 is a block diagram of an alternative transmitter with linearization and dynamic power amplifier biasing according to an example embodiment.

A further embodiment of a system 400 for synchronizing the dynamic bias signal with the transmission signal is shown in FIG. 4. In system 400, where the numbering is consistent with FIGS. 1 and 2, a Multi-channel Synchronizer 410 is used to independently and simultaneously control Variable Delay 1 block 125 and variable delay 2 block 145. The Multi-channel Synchronizer 410 estimates the phase and amplitude of $S_{in}$ and $S_{obs}$. Observation synchronization for predistortion is determined to minimize the phase difference between of $S_{on}$ and $S_{obs}$. The dynamic bias synchronization is determined to maximize the cross correlation of the magnitude of $S_{in}$ and $S_{obs}$ (including the use of early-late gate techniques). In this manner, both observation and dynamic bias synchronization are achieved in real-time.

One or more embodiments described may provide a high efficiency power amplifier architecture without loss of signal quality. The variable delay block for the dynamic bias signal may be controlled to allow for synchronization with the transmission signal. Some embodiments enables decoupling of the observation and dynamic bias synchronization algorithms. Systems 100 and 400 may allow for real-time and continuous synchronization without transmission interruption. Various embodiments may also enable fast and effective automated synchronization without the requirement for manual calibration. Various measurements and feedback synchronization information utilized in the systems may be implemented with off-the-shelf digital signal processing (DSP) blocks. The robust synchronization control systems described may be applied to improve the reliability and power efficiency of signal transmitters in different fields such as, but not limited to, RF transmission, Hi-Fi audio, Hi-Fi video, optical transmission and, generally, in systems where high-quality of electrical/electro-mechanical/electro-optical/electro-magnetic signal transformation are desired.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A power amplifier system comprising:
    a nonlinear power amplifier that receives a predistorted input signal;
    a linear receiver that receives an output signal from the nonlinear power amplifier and provides an observed signal;
    a bias controller that provides a delayed dynamic bias signal to the nonlinear power amplifier wherein the delayed dynamic bias signal is variable and is a function of the observed signal for synchronizing the predistorted input signal with the delayed dynamic bias signal.

2. The power amplifier system of claim 1 and further comprising a frequency selective power meter that provides a signal representative of the quality of the observed signal for selected frequencies.

3. The power amplifier system of claim 1 and further comprising:
    a predistortion gain block that provides the predistorted input signal; and
    an adaptive predistortion controller coupled to the linear receiver for receiving the observed signal and control the gain of the predistortion gain block.

4. The power amplifier system of claim 3 wherein the predistortion controller determines a predistortion variable delay to synchronize the gain of the predistortion gain block with an input signal, and wherein the predistortion controller provides feedback synchronization information to the bias controller for determining the delayed dynamic bias signal.

5. The power amplifier system of claim 4 wherein the predistortion variable delay is determined as a function of minimizing a phase difference between the input signal and the observed signal.

6. The power amplifier system of claim 5 wherein the delayed dynamic bias signal is determined to maximize a cross correlation of the magnitudes of the input signal and the observed signal.

7. The power amplifier system of claim 6 wherein the delayed dynamic bias signal is determined after the predistortion variable delay.

8. The power amplifier system of claim 1 and further comprising:
  a predistortion gain block that provides the predistorted input signal;
  an adaptive predistortion controller coupled to the linear receiver for receiving the observed signal and control the gain of the predistortion gain block; and
  a multichannel synchronizer coupled to the linear receiver and the predistorted input signal for dynamically determining a predistortion variable delay and the delayed dynamic bias signal.

9. The power amplifier of claim 8 wherein the predistortion variable delay is determined as a function of minimizing a phase difference between the predistorted input signal and the observed signal and wherein the delayed dynamic bias signal is determined to maximize the cross correlation of the magnitude of the predistorted input signal and the observed signal.

10. A power amplifier system comprising:
  a nonlinear power amplifier;
  means for predistorting an input signal to linearize an output of the power amplifier;
  means for providing a variably delayed dynamic bias signal to the nonlinear power amplifier.

11. The power amplifier system of claim 10 wherein the variably delayed dynamic bias signal is delayed as a function of an observed output signal from the nonlinear power amplifier.

12. The power amplifier system of claim 10 wherein the means for predistorting the input signal to linearize the output of the power amplifier comprises a variable predistortion control delay.

13. The power amplifier system of claim 10 wherein the variably delayed dynamic bias signal is a function of early-late amplitude cross correlation observation.

14. The power amplifier system of claim 10 wherein the variably delayed dynamic bias signal is a function of frequency selective power measurements.

15. The power amplifier system of claim 10 wherein the dynamic bias signal delay is a function of observed synchronization of input signal predistortion as an input signal predistortion is held constant.

16. A method comprising:
  adjusting a first variable delay for an adaptive predistortion controller for a predistortion gain block for predistorting an input signal for amplification by a nonlinear amplifier while holding a dynamic bias signal for the nonlinear amplifier constant;
  upon synchronization of the adaptive predistortion controller, holding the first variable delay constant and activating modulation of the dynamic bias signal; and
  adjusting a second variable delay corresponding to the dynamic bias signal until the adaptive predistortion controller is resynchronized.

17. The method of claim 16 and further comprising upon synchronization of the adaptive predistortion controller, sending the first variable delay to a bias controller for use in adjusting the second variable delay.

18. The method of claim 16 wherein adjustment of the second variable delay is done in a direction corresponding to a comparison between an input signal and an observed output of the nonlinear power amplifier.

19. The method of claim 18 wherein the first variable delay is determined as a function of an early-late amplitude cross correlation observation between the input signal and the observed output of the nonlinear power amplifier.

20. The method of claim 16 wherein the adjusted second variable delay is held constant and the first variable delay is adjusted again.

* * * * *